(12) United States Patent
Kooken et al.

(10) Patent No.: US 10,668,551 B2
(45) Date of Patent: Jun. 2, 2020

(54) HIGH RELIABILITY MODULAR WELDING POWER SUPPLY SYSTEM

(71) Applicant: Lincoln Global, Inc., Santa Fe Springs, CA (US)

(72) Inventors: Todd E. Kooken, Solon, OH (US); Lifeng Luo, Solon, OH (US)

(73) Assignee: LINCOLN GLOBAL, INC., Santa Fe Springs, CA (US)

( * ) Notice: Subject to any disclaimer, the term of this patent is extended or adjusted under 35 U.S.C. 154(b) by 340 days.

(21) Appl. No.: 15/849,855

(22) Filed: Dec. 21, 2017

(65) Prior Publication Data

US 2019/0193183 A1   Jun. 27, 2019

(51) Int. Cl.
*B23K 9/10* (2006.01)
*H05K 5/02* (2006.01)
(Continued)

(52) U.S. Cl.
CPC ............ *B23K 9/1043* (2013.01); *B23K 9/095* (2013.01); *B23K 9/1062* (2013.01);
(Continued)

(58) Field of Classification Search
CPC .... B23K 9/1043; B23K 9/095; B23K 9/1062; B23K 9/1068; B23K 9/1075; B23K 9/32; H05K 5/0286
(Continued)

(56) References Cited

U.S. PATENT DOCUMENTS

| | | | | |
|---|---|---|---|---|
| 2,680,225 A | * | 6/1954 | Stevens, Jr. ............ | H01C 10/16 323/354 |
| 3,177,338 A | * | 4/1965 | Hoffman ............... | B23K 9/1068 219/130.1 |
| 3,278,721 A | * | 10/1966 | Roe ...................... | B23K 9/1068 219/130.1 |
| 5,406,050 A | | 4/1995 | Macomber et al. | |
| 5,837,968 A | | 11/1998 | Rohrberg et al. | |

(Continued)

FOREIGN PATENT DOCUMENTS

CN    101963801 A    2/2011

OTHER PUBLICATIONS

Chroma Ate, Inc.; "Modular DC Power Supply"; http://www.chromausa.com/pdf/62000B-E.pdf; Accessed on Jul. 28, 2017; 6 Pages.

(Continued)

*Primary Examiner* — Huyen D Le
(74) *Attorney, Agent, or Firm* — David J. Muzilla

(57) ABSTRACT

Embodiments of modular-based power supply systems to support welding or cutting operations are disclosed. One embodiment includes a module rack having multiple slots configured to accept electrical input power from a single power drop within a welding or cutting environment. Multiple power supply modules are provided that are configured to be inserted into and withdrawn from the multiple slots. Each power supply module is configured to accept an electrical AC input derived from the electrical input power and provide an electrical DC output. The module rack is (Continued)

configured to support reconfigurable parallel electrical connections of subsets of the power supply modules. Each subset is configured to electrically connect to an output power supply stage to provide a dynamic waveform-controlled welding or cutting electrical signal to support generation of a single arc between an electrode and a workpiece.

20 Claims, 8 Drawing Sheets

(51) Int. Cl.
  *B23K 9/095* (2006.01)
  *B23K 9/32* (2006.01)
(52) U.S. Cl.
  CPC .......... *B23K 9/1068* (2013.01); *B23K 9/1075* (2013.01); *B23K 9/32* (2013.01); *H05K 5/0286* (2013.01)
(58) Field of Classification Search
  USPC ...................................... 219/130.1
  See application file for complete search history.

(56) References Cited

U.S. PATENT DOCUMENTS

| | | | |
|---|---|---|---|
| 6,023,037 A | * | 2/2000 | Church .............. B23K 9/1006 219/121.39 |
| 6,177,645 B1 | | 1/2001 | Church et al. |
| 6,713,721 B2 | | 3/2004 | Albrecht |
| 9,636,765 B2 | | 5/2017 | Peters |
| 2006/0175313 A1 | | 8/2006 | Kooken et al. |
| 2007/0047180 A1 | | 3/2007 | Wirtzberger et al. |
| 2007/0109736 A1 | | 5/2007 | Coglitore |
| 2011/0155703 A1 | | 6/2011 | Winn |
| 2014/0021179 A1 | | 1/2014 | Schartner |
| 2015/0014290 A1 | | 1/2015 | Kooken et al. |

OTHER PUBLICATIONS

Digi-Key Electronics; "Properly Configure Parallel Power Supplies to Share Load Current or Risk System Failure;" https://www.digikey.com/en/articles/techzone/2016/sep/properly-configure-parallel-power-supplies; Dated Sep. 28, 2016; 4 Pages.

Extended European Search Report from Corresponding Application No. 18215366.8; dated Jun. 12, 2019; pp. 1-8.

* cited by examiner

HIGH RELIABILITY MODULAR WELDING POWER SUPPLY SYSTEM

CROSS REFERENCE TO RELATED APPLICATIONS/INCORPORATION BY REFERENCE

U.S. Patent Application No. 2015/0014290 A1 entitled "Welding System and Method of Welding", filed on Oct. 2, 2014, is incorporated herein by reference in its entirety.

FIELD

Embodiments of the present invention relate to systems associated with a welding or cutting environment. More specifically, embodiments of the present invention relate to reconfigurable systems for generating one or more arcs for welding or cutting.

BACKGROUND

In a welding or cutting environment (e.g., in a factory environment where welding or cutting is performed), many welding or cutting power supplies may be located at various locations within the welding or cutting environment to support various welding or cutting operations throughout the environment. When a power supply has a problem and shuts down, the corresponding welding or cutting operation is also shut down until the problem can be resolved. The ability to have a power supply configuration that allows the corresponding welding or cutting operation to continue, even while the problem is being resolved, is desirable.

SUMMARY

Embodiments of the present invention include systems to support the generation of one or more (multiple) arcs for welding or plasma cutting in a welding or cutting environment (e.g., a factory). A reconfigurable modular power supply system provides redundancy, improved reliability, improved up-time, and improved serviceability across the welding or cutting environment. Such improvements are achieved by the implementation of hot-swappable power supply modules in a reconfigurable module rack. As used herein, power supply modules that are hot-swappable are power supply modules that can be removed from and inserted into a module rack without stopping or shutting down the associated welding or cutting system (i.e., without interruption to the on-going welding or cutting operation). Hot-swapping can be achieved by rack and module design particulars as well as by employing a controller implementing hot-swapping control techniques, as discussed later herein.

One embodiment includes a system to support the generation of multiple arcs for welding or cutting within a welding or cutting environment. The system includes a module rack having a plurality of module slots. The module rack is configured to accept electrical input power from a single power drop within the welding or cutting environment via a power disconnect box. The system also includes a plurality of power supply modules (e.g., hot-swappable power supply modules) configured to be respectively inserted into and withdrawn from the plurality of module slots. Each power supply module is configured to accept an electrical AC input derived from the electrical input power and provide an electrical DC output. The module rack is configured to support reconfigurable parallel electrical connections of subsets of the power supply modules inserted into the module rack. The system further includes a plurality of output power supply stages. An electrical input of each output power supply stage is configured to connect to an electrical output of a separate subset of the subsets of the power supply modules. Each output power supply stage is configured to provide a dynamic waveform-controlled welding or cutting electrical signal to support the generation of a single arc, of the multiple arcs, between an electrode and a workpiece for welding or cutting. The system also includes a controller operatively interfacing to the module rack, in one embodiment. The controller is configured to define and electrically connect in parallel a first subset of the power supply modules within the module rack. The controller is also configured to electrically connect a newly inserted power supply module into the first subset while avoiding generating electrical surges within the module rack, and while avoiding generating disturbances in a first welding or cutting electrical signal associated with the first subset during a first welding or cutting operation. In one embodiment, each power supply module includes a first power supply stage and a second power supply stage. In one embodiment, each power supply module includes an AC to DC converter circuit. In one embodiment, each power supply module includes an unregulated DC to DC converter circuit. In one embodiment, each power supply module includes an inverter circuit with an isolation transformer and a rectifier circuit. In one embodiment, each output power supply stage includes a chopper circuit. In one embodiment, each output power supply stage is configured to be located remotely from the module rack and be electrically connected to the module rack via an electrical cable. In another embodiment, each output power supply stage is configured to be located within the module rack.

One embodiment includes a system to support the generation of multiple arcs for welding or cutting within a welding or cutting environment. The system includes a module rack having a plurality of module slots. The module rack is configured to accept electrical input power from a single power drop within the welding or cutting environment via a power disconnect box. The system also includes a plurality of power supply modules (e.g., hot-swappable power supply modules) configured to be respectively inserted into and withdrawn from the plurality of module slots. Each power supply module is configured to accept an electrical AC input derived from the electrical input power and provide an electrical DC output. Each power supply module is also configured to provide a dynamic waveform-controlled output signal. The module rack is configured to support reconfigurable parallel electrical connections of subsets of the power supply modules inserted into the module rack. The system also includes a controller operatively interfacing to the module rack and configured to synchronize the dynamic waveform-controlled output signal of each power supply module, within each subset, with each other to provide a welding or cutting electrical signal from each subset. Synchronization of the dynamic waveform-controlled output signals of each subset is based on feedback information from each corresponding subset, in accordance with one embodiment. The welding or cutting electrical signal from each subset supports generation of a single arc, of the multiple arcs, between an electrode and a workpiece for welding or cutting. In one embodiment, the controller is configured to define and electrically connect in parallel a first subset of the power supply modules within the module rack. The controller is also configured to electrically connect a newly inserted power supply module into the first subset while avoiding generating electrical surges within the module rack, and while avoiding generating disturbances in a first welding or cutting electrical signal associated with the first subset during a first welding or cutting operation. In one embodiment, the controller is configured to report a failure of a power supply module to an external reporting system. In one embodiment, each power supply module includes a first power supply stage, a second power supply stage, and a third power supply stage. In one embodiment, each power supply module includes an AC to DC converter circuit. In one embodiment, each power supply module includes an unregulated DC to DC converter circuit. In one embodiment, each power supply module includes an inverter circuit with an isolation transformer and a rectifier circuit. In one embodiment, each power supply module includes a chopper circuit.

One embodiment includes a system to support the generation of at least one arc for welding or cutting within a welding or cutting environment. The system includes a module rack having a plurality of module slots. The module rack is configured to accept electrical input power from a single power drop within a welding or cutting environment via a power disconnect box. The system includes a plurality of power supply modules (e.g., hot-swappable power supply modules) configured to be respectively inserted into and withdrawn from the plurality of module slots. The module rack is configured to support reconfigurable parallel electrical connections of the plurality of power supply modules inserted into the module rack. The system further includes a controller configured to electrically connect a newly replaced power supply module within the module rack while avoiding generating electrical surges within the module rack, and while avoiding generating disturbances in a welding or cutting electrical signal supported by the module rack during a welding or cutting operation. In one embodiment, the controller is configured to report a failure of a power supply module to an external reporting system.

Numerous aspects of the general inventive concepts will become readily apparent from the following detailed description of exemplary embodiments, from the claims, and from the accompanying drawings.

BRIEF DESCRIPTION OF THE DRAWINGS

The accompanying drawings, which are incorporated in and constitute a part of the specification, illustrate various embodiments of the disclosure. It will be appreciated that the illustrated element boundaries (e.g., boxes, groups of boxes, or other shapes) in the figures represent one embodiment of boundaries. In some embodiments, one element may be designed as multiple elements or that multiple elements may be designed as one element. In some embodiments, an element shown as an internal component of another element may be implemented as an external component and vice versa. Furthermore, elements may not be drawn to scale.

DETAILED DESCRIPTION

Figure 1:
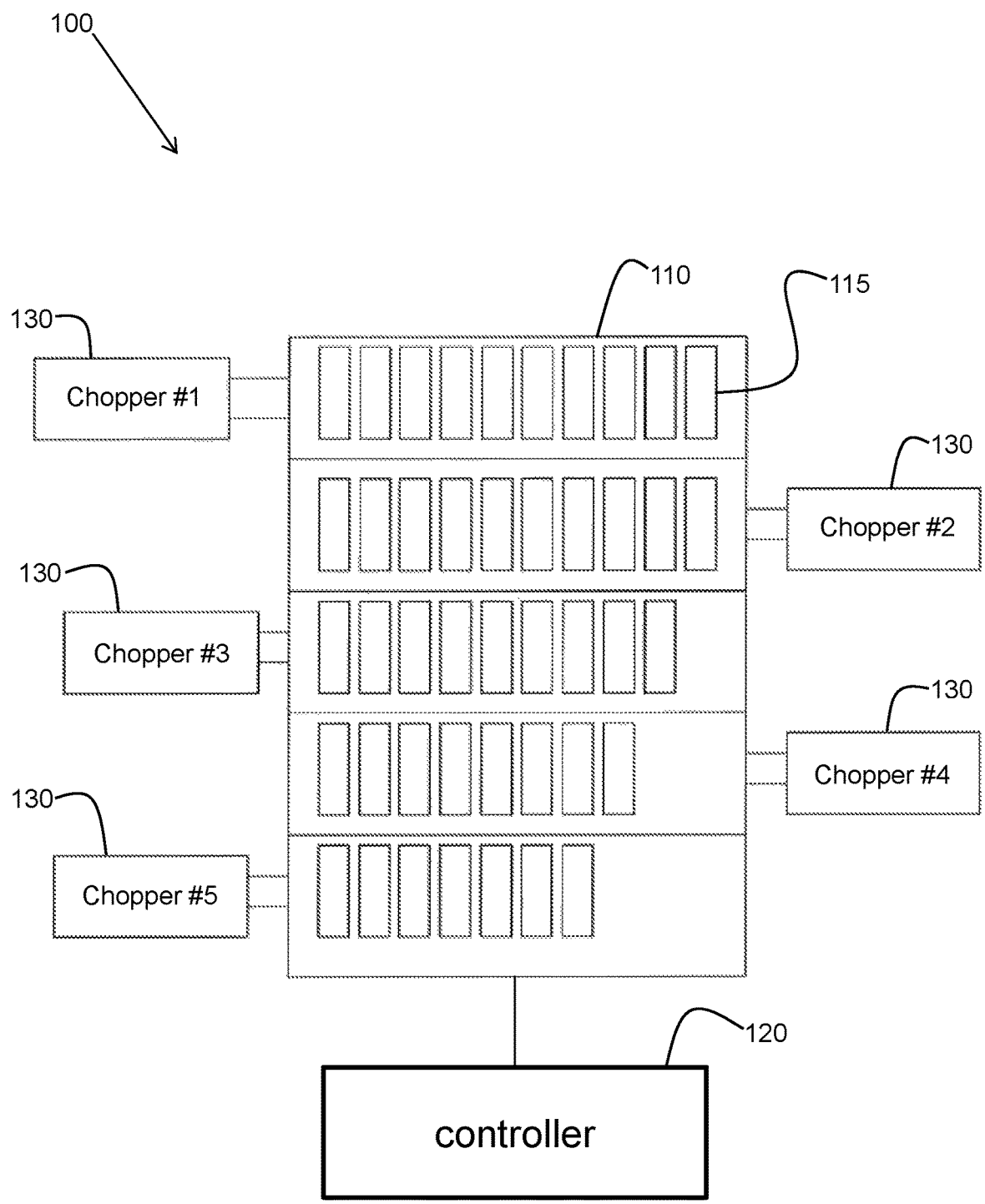
FIG. 1 illustrates a first embodiment of a reconfigurable multi-arc system to support the generation of multiple arcs for welding or cutting in a welding or cutting environment.

Embodiments of reconfigurable systems to support the generation of one or more arcs for welding or cutting in a welding or cutting environment are disclosed. In one embodiment, a reconfigurable multi-arc system is disclosed. The reconfigurable multi-arc system includes a module rack and multiple power supply modules (e.g., hot-swappable power supply modules) organized within the module rack to support the generation of multiple arcs for welding or cutting within a welding or cutting environment.

The examples and figures herein are illustrative only and are not meant to limit the subject invention, which is measured by the scope and spirit of the claims. Referring now to the drawings, wherein the showings are for the purpose of illustrating exemplary embodiments of the subject invention only and not for the purpose of limiting same, FIG. 1 illustrates a first embodiment of a reconfigurable multi-arc system 100 to support the generation of multiple arcs for welding or plasma cutting in a welding or cutting environment.

Referring to FIG. 1, the reconfigurable multi-arc system 100 includes a module rack 110 having multiple module slots 115. Each module slot 115 is configured to have a power supply module inserted into and withdrawn from a slot in a hot-swappable manner. The power supply modules can support one or more welding or cutting operations. The power supply modules are hot-swappable and can be removed from and inserted into the module rack 110 without stopping or shutting down the associated welding or cutting system (i.e., without interruption to an on-going welding or cutting operation). Hot-swapping can be achieved by rack and module design particulars as well as by employing a controller implementing hot-swapping control techniques. An embodiment of a power supply module is discussed later herein with respect to FIG. 2. In another embodiment, the power supply modules are not hot-swappable.

In accordance with one embodiment, the module rack 110 includes wiring and/or traces and controllable switches that support reconfigurable electrical connections of the power supply modules. For example, the module rack 110 may include a reconfigurable backplane that allows various combinations or subsets of power supply modules to be electrically connected to each other. The reconfigurable backplane may be under the control of a programmable controller, for example, in accordance with one embodiment. Furthermore, in one embodiment, the module rack 110 is configured to accept electrical input power (e.g., 460 VAC) from a single power drop within a welding or cutting environment via, for example, a power disconnect box having, for example, switches and fuses. Electrical power distributed to the inputs of individual power supply modules within the module rack 110 is derived from the electrical input power (e.g., under the control of a controller).

The system 100 includes a controller 120 operatively interfacing to the module rack 110. In one embodiment, the controller 120 is configured to define subsets of the power supply modules within the module rack 110. The controller 120 is also configured to command electrical connection of a defined subset of the power supply modules in parallel via the module rack (e.g. by reconfiguring a backplane of the module rack 110). Such a subset of power supply modules can be used in a welding or cutting operation to support generation of a single arc between an electrode and a workpiece for welding or cutting in a welding or cutting environment. In such an embodiment, the controller 120 provides flexibility in defining a subset of power supply modules within the module rack 110 to be electrically connected together in parallel. In the extreme, a subset can include a single power supply module. Redundancy can be provided by having the total power supplied by the multiple power supply modules within the module rack 110 be more than the total output power requirement from the module rack 110. Furthermore, in accordance with one embodiment, the controller 120 is configured to reduce the output power when some of the power supply modules are down.

The controller 120 is also configured to electrically connect a newly inserted hot-swappable power supply module into a subset while avoiding generating electrical surges within the module rack 110, and while avoiding generating disturbances in a welding or cutting electrical signal associated with the subset during a welding or cutting operation. In accordance with one embodiment, the controller 120 can avoid the occurrence of such surges and disturbances by bringing a newly inserted power supply module on-line slowly (e.g., by slowly powering up the newly inserted power supply module) and/or by electrically connecting various input and output pins of the newly inserted power supply module in a particular order. The controller is configured to balance the power draw from each module by ramping up the power of a newly inserted module and ramping down the power of existing on-line modules, in accordance with one embodiment.

In another embodiment, the subsets of power supply modules are defined largely by the module rack 110. For example, referring to FIG. 1, five (5) rows of slots 115 are shown within the module rack 110 which can be populated with hot-swappable power supply modules. The first row defines a first subset corresponding to up to ten (10) modules. Similarly, the second through fifth rows each define subsets corresponding to, respectively, up to ten (10), nine (9), eight (8), and seven (7) modules. In such an embodiment, the controller 120 is still used to support hot-swapping of the power supply modules to avoid surges and disturbances.

As shown in FIG. 1, each subset (row) of slots 115, which may be populated with hot-swappable power supply modules, can be electrically connected to a chopper circuit 130 serving as an output power supply stage. Other types of output power supply stages (other than a chopper circuit) are possible as well, in accordance with other embodiments. An electrical input of each output power supply stage 130 is configured to be connected to an electrical output of a separate subset of the hot-swappable power supply modules that are connected in parallel.

Each output power supply stage 130 provides a dynamic waveform-controlled welding or cutting signal to support generation of a single arc between an electrode and a workpiece for welding or cutting. For example, a dynamic waveform-controlled welding or cutting signal from an output power supply stage 130 may be provided to a welding gun/torch and/or welding wire feeder within a welding or cutting environment. In this manner, the system 100 of FIG. 1 provides the dynamic welding or cutting voltages and currents to support various welding or cutting operations and modes. In accordance with one embodiment, each output power supply stage 130 (e.g., chopper circuit) is under the control of a separate controller and/or a waveform generator. U.S. Patent Application No. 2015/0014290 A1, which is incorporated by reference herein, describes various configurations of output power supply stages that are controlled by a controller and/or a waveform generator.

Figure 2:
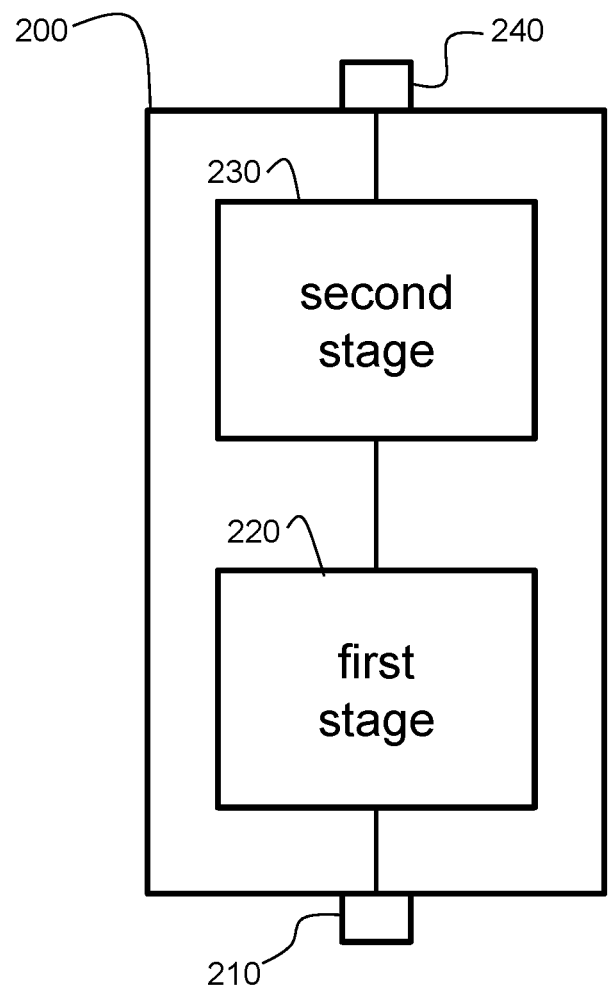
FIG. 2 illustrates a first embodiment of a power supply module (e.g., a hot-swappable power supply module) that may be used in the systems of FIG. 1, FIG. 3, FIG. 4, or FIG. 5.

FIG. 2 illustrates a first embodiment of a hot-swappable power supply module 200 that may be used in the systems 100, 300, 400, and 500 of FIG. 1, FIG. 3, FIG. 4, and FIG. 5, respectively. The hot-swappable power supply module 200 is configured to be inserted into and withdrawn from, for example, any of the slots 115 in the module rack 110 in a hot-swappable manner. The hot-swappable power supply module 200 includes an electrical input connector 210, a first power supply stage 220, a second power supply stage 230, and an electrical output connector 240.

The electrical input connector 210 is configured to accept electrical input power (e.g., AC input power). In one embodiment, the electrical input connector 210 is also configured to accept one or more control signals from a controller (e.g., from the controller 120 via a backplane of the module rack 110). The one or more control signals control the operations of the first power supply stage 220 and the second power supply stage 230, in accordance with one embodiment. U.S. Patent Application No. 2015/0014290 A1, which is incorporated by reference herein, describes various types of first (I) and second (II) power supply stages that are controlled by a controller. The electrical output connector 240 is configured to output an unregulated electrical DC signal. In one embodiment, the electrical output connector 240 is also configured to output one or more feedback signals to a controller (e.g., to the controller 120 via a backplane of the module rack 110). The feedback signals may be derived from, for example, an output voltage and/or an output current of the module 200, in accordance with one embodiment, which are used by the controller 120 to modify the control signals.

The feedback signals can also include module status signals. For example, a feedback signal can indicate when a particular module has failed (or has gone off-line). The controller can use the feedback information to report the failure to, for example, an external reporting system. As a result, a service call can be initiated to replace the failed module. Furthermore, the controller can use the feedback information to take the failed module off-line and bring another module on-line in its place within the associated subset of modules. In this manner, the operation (e.g., power, waveform, timing) and the status (e.g., failed module) of each power supply module can be monitored and controlled, and power supply modules can be taken off-line and brought on-line in a real-time, dynamic manner.

In one embodiment, the first power supply stage 220 is an AC to DC converter circuit. The second power supply stage 230 is an unregulated DC to DC converter circuit. For example, in one embodiment, the second power supply stage 230 may include an inverter circuit with an isolation transformer and a rectifier circuit. The first power supply stage 220 accepts an electrical AC input signal, derived from the electrical input power to the module rack 110, at the electrical input connector 210. The second power supply stage 230 outputs an electrical DC output signal at the electrical output connector 240. Providing an electrical AC input to the module 200 is facilitated by a backplane of the module rack 110, in accordance with one embodiment. Also, routing the electrical DC output signal away from the electrical output connector 240 is facilitated by the backplane of the module rack 110, in accordance with one embodiment. In accordance with one embodiment, The AC to DC converter circuit of the first power supply stage 220 is configured to provide a power factor correction function.

U.S. Patent Application No. 2015/0014290 A1, which is incorporated by reference herein, describes various types of first (I) and second (II) power supply stages. Other types of hot-swappable power supply modules are possible as well, in accordance with other embodiments. For example, in one embodiment, a hot-swappable power supply module may have a single stage. In another embodiment, a hot-swappable power supply module may have three stages. The numbers and types of stages depend on the design considerations and constraints associated with any particular application.

In accordance with one embodiment, each hot-swappable power supply module 200 provides 50 amps of electrical current. Therefore, a subset of such hot-swappable power supply modules 200 electrically connected in parallel can provide an electrical current of N×50 amps, where N is the number of power supply modules 200 connected in parallel. Therefore, depending on the current need for a particular welding or cutting operation, the controller 120 can select the number N of power supply modules 200 to be electrically connected and used for that operation. In accordance with other embodiments, each hot-swappable power supply module 200 provides some other amount of electrical current (e.g. 25 amps, or 75 amps, or 100 amps).

In the embodiment of FIG. 1, each output power supply stage 130 (e.g., a chopper circuit) is external to the module rack 110. For example, in accordance with one embodiment, the module rack 110 is centrally located within a welding or cutting environment, accepting electrical input power from a single power drop via a power disconnect box. Each chopper circuit 130 is located remotely from the module rack 110 at a robotic welding or cutting station within the welding or cutting environment and is electrically connected to the module rack 110 via electrical cables. In this way, a single module rack 110 can support the generation of multiple welding or cutting arcs throughout the welding or cutting environment. The DC outputs out of the module rack 110 are not affected by the inductance of the electrical cables connecting the module rack 110 to the various chopper circuits 130 at the welding or cutting stations. Therefore, fairly long cable lengths can be accommodated across a welding or cutting environment.

Figure 3:
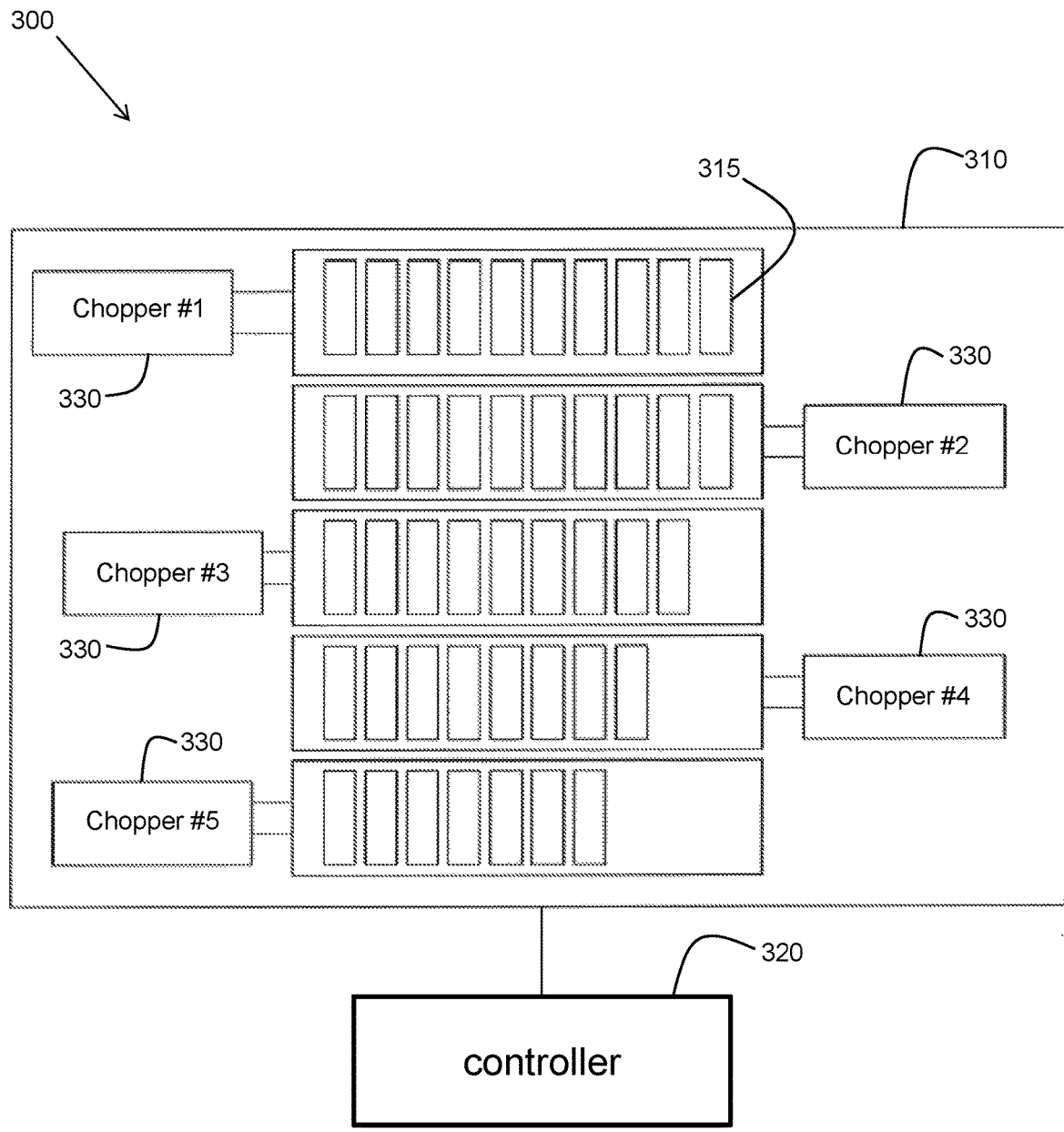
FIG. 3 illustrates a second embodiment of a reconfigurable multi-arc system to support the generation of multiple arcs for welding or cutting in a welding or cutting environment.

FIG. 3 illustrates a second embodiment of a reconfigurable multi-arc system 300 to support the generation of multiple arcs for welding or cutting in a welding or cutting environment. The system 300 of FIG. 3 is similar to the system 100 of FIG. 1 in that the system 300 includes a module rack 310 having module slots 315 (similar to the module slots 115 to accept the modules 200), a controller 320 (similar to the controller 120), and output power supply stages (e.g., chopper circuits) 330 (similar to the output power supply stages 130). However, in the system 300 of FIG. 3, the output power supply stages (e.g., chopper circuits) 330 are located within the module rack 310, not externally to the module rack 310. In one embodiment, the controller 320 can determine which chopper circuit 330 to connect to which subset of hot-swappable power supply modules via, for example, a backplane of the module rack 310. Furthermore, in accordance with one embodiment, the controller 320 also controls the operation of each of the output power supply stages 330. In accordance with another embodiment, each output power supply stage 330 may be controlled by a dedicated controller within the module rack 310. The system 300 of FIG. 3 may be desirable when used in a welding or cutting environment that is relatively small, mitigating the use of long cable lengths to the welding or cutting stations.

Figure 4:
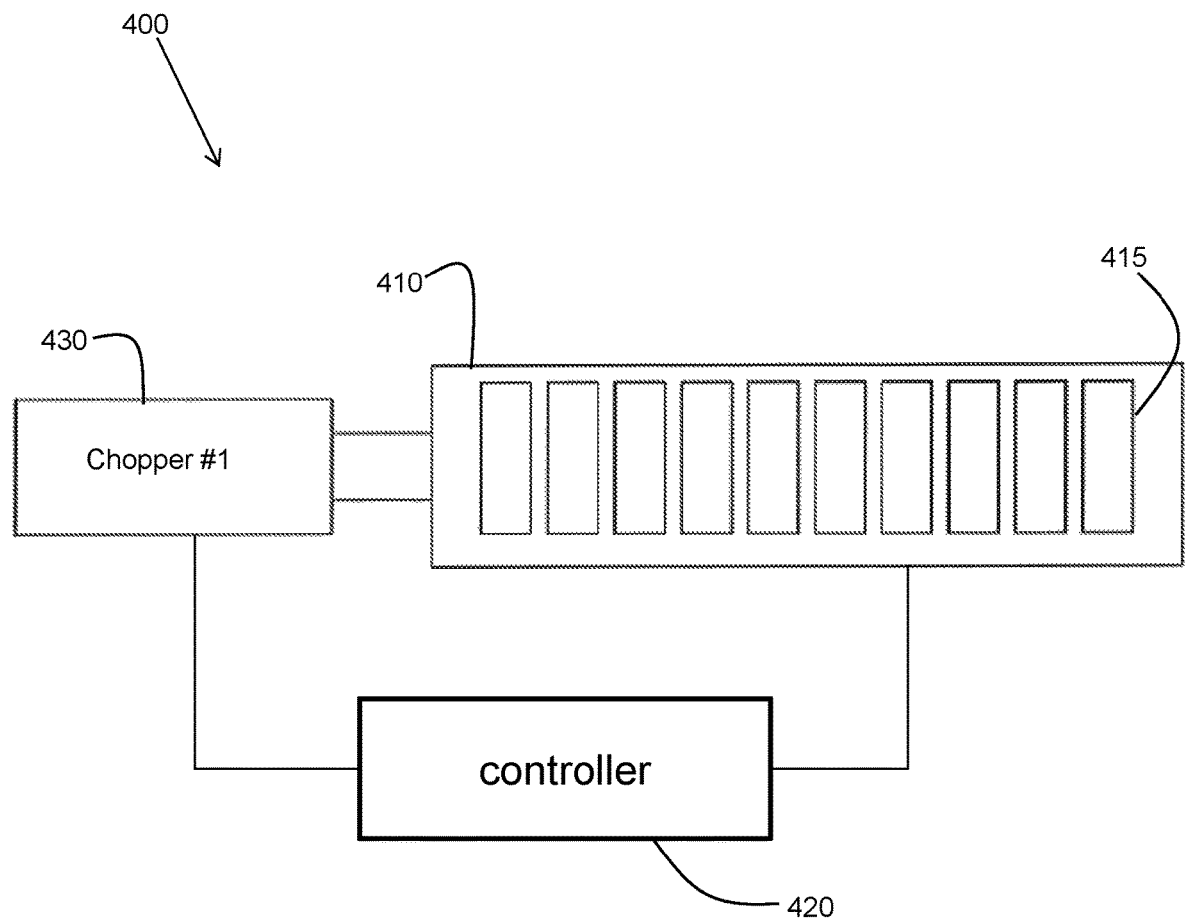
FIG. 4 illustrates a first embodiment of a reconfigurable single-arc system to support the generation of a single arc for welding or cutting in a welding or cutting environment.

FIG. 4 illustrates a first embodiment of a reconfigurable single-arc system 400 to support the generation of a single arc for welding or cutting in a welding or cutting environment. The system 400 includes a module rack 410 having module slots 415 to accommodate hot-swappable power supply modules (e.g., 200). The system also includes a controller 420 and an output power supply stage (e.g., a chopper circuit) 430. The system 400 is similar to a portion of the system 100 of FIG. 1. For example, the module rack 410 may be equivalent to the first row of the module rack 110 in FIG. 1. The chopper circuit 430 may be equivalent to the chopper #1 130 in FIG. 1. The controller 420 may be somewhat similar to the controller 120 in FIG. 1. However, in the system 400 of FIG. 4, only the generation of a single arc is supported (e.g., at a robotic welding or cutting work station or at a manual welding or cutting work station) within a welding or cutting environment.

In the embodiment of FIG. 4, the controller 420 determines which power supply modules to use to provide an electrical input to the chopper circuit 430. The controller 420 also allows the power supply modules to be replaced in the slots 415 in a hot-swappable manner. Furthermore, in accordance with one embodiment, the controller 420 controls the operation of the chopper circuit 430. For example, in one embodiment, the controller 420 includes a waveform generator to facilitate the generation of a dynamic waveform-controlled welding or cutting electrical signal by the chopper circuit 430. Examples of controlling a chopper circuit via a waveform generator are disclosed in U.S. Patent Application No. 2015/0014290 A1, which is incorporated by reference herein. In this manner, a smaller module rack can be provided to support a single arc operation. Also, the DC output out of the module rack 410 is not affected by the inductance of the electrical cable connecting the module rack 410 to the chopper circuit 430 at the welding or cutting station. Therefore, a fairly long cable length can be accommodated.

Figure 5:
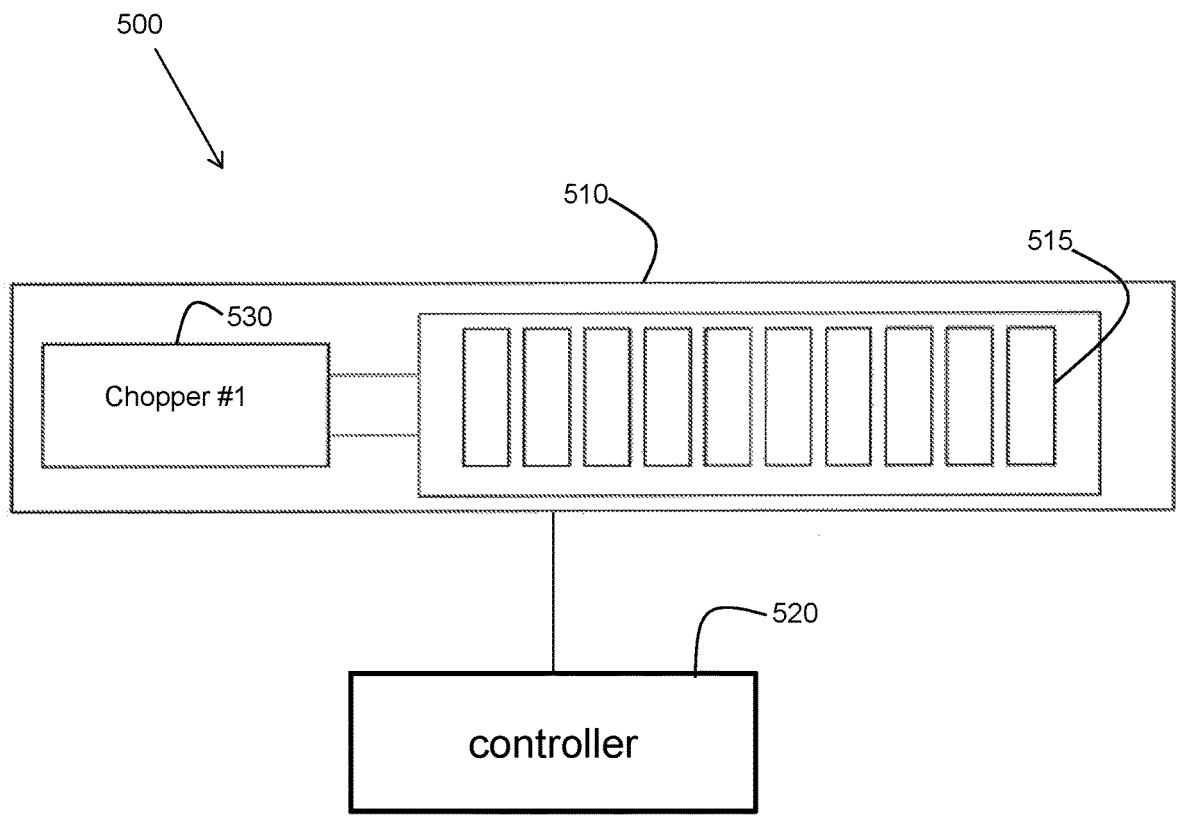
FIG. 5 illustrates a second embodiment of a reconfigurable single-arc system to support the generation of a single arc for welding or cutting in a welding or cutting environment.

FIG. 5 illustrates a second embodiment of a reconfigurable single-arc system 500 to support the generation of a single arc for welding or cutting in a welding or cutting environment. The system 500 is similar to the system 400 of FIG. 4 in that the system 500 includes a module rack 510 having module slots 515 (similar to the module slots 415 to accept the modules 200), a controller 520 (similar to the controller 420), and an output power supply stage (e.g., a chopper circuit) 530 (similar to the output power supply stage 430). However, in the system 500 of FIG. 5, the output power supply stage (e.g., the chopper circuit) 530 is located within the module rack 510, not externally to the module rack 510. In one embodiment, the controller 520 determines which power supply modules to use to provide an electrical input to the chopper circuit 530. The controller 520 also allows the power supply modules to be replaced in the slots 515 in a hot-swappable manner. Furthermore, in accordance with one embodiment, the controller 520 controls the operation of the chopper circuit 530. The system 500 of FIG. 5 may be desirable when used in a welding or cutting environment that is relatively small, mitigating the use of a long cable length to the welding or cutting station. In this manner, a smaller module rack can be provided to support a single arc operation.

Figure 6:
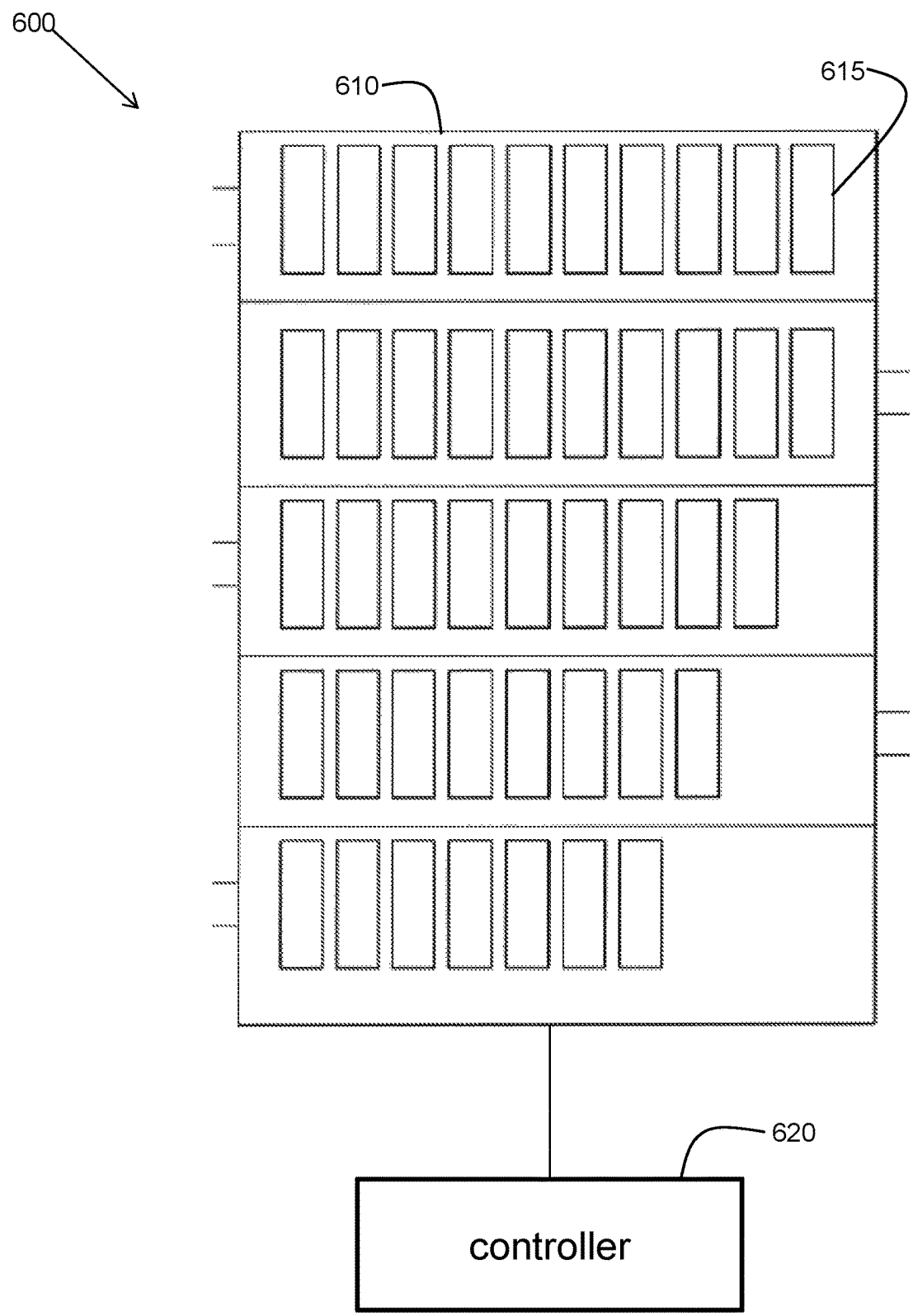
FIG. 6 illustrates a third embodiment of a reconfigurable multi-arc system to support the generation of multiple arcs for welding or cutting in a welding or cutting environment.

FIG. 6 illustrates a third embodiment of a reconfigurable multi-arc system 600 to support the generation of multiple arcs for welding or cutting in a welding or cutting environment. In the embodiment of FIG. 6, an output power supply stage is part of each hot-swappable power supply module. The dynamic waveform-controlled output signals generated by the output power supply stages of the hot-swappable power supply modules in a defined subset are synchronized and combined to generate a total welding or cutting electrical signal for welding or cutting.

The reconfigurable multi-arc system 600 includes a module rack 610 having multiple module slots 615. Each module slot 615 is configured to have a power supply module (which includes an output power supply stage) inserted into and withdrawn from a slot in a hot-swappable manner. The power supply modules can support one or more welding or cutting operations. The power supply modules are hot-swappable and can be removed from and inserted into the module rack 610 without stopping or shutting down the associated welding or cutting system (i.e., without interruption to an on-going welding or cutting operation). Hot-swapping can be achieved by rack and module design particulars as well as by employing a controller implementing hot-swapping control techniques. An embodiment of a power supply module is discussed later herein with respect to FIG. 7.

In accordance with one embodiment, the module rack 610 includes wiring and/or traces and controllable switches that support reconfigurable electrical connections of the power supply modules. For example, the module rack 610 may include a reconfigurable backplane that allows various combinations or subsets of power supply modules to be electrically connected to each other. The reconfigurable backplane may be under the control of a programmable controller, for example. Furthermore, in one embodiment, the module rack 610 is configured to accept electrical input power (e.g., 460 VAC) from a single power drop within a welding or cutting environment via, for example, a power disconnect box having, for example, switches and fuses. Electrical power distributed to the inputs of individual power supply modules within the module rack 610 is derived from the electrical input power (e.g., under the control of a controller).

The system 600 includes a controller 620 operatively interfacing to the module rack 610. In one embodiment, the controller 620 is configured to define subsets of the power supply modules within the module rack 610. The controller 620 is also configured to command electrical connection of a defined subset of the power supply modules in parallel via the module rack 610 (e.g. by reconfiguring a backplane of the module rack 610). Such a subset of power supply modules can be used in a welding or cutting operation to support generation of a single arc between an electrode and a workpiece for welding or cutting in a welding or cutting environment. In such an embodiment, the controller 620 provides flexibility in defining a subset of power supply modules within the module rack 610 to be electrically connected together in parallel.

Each power supply module is configured to output a dynamic waveform-controlled output signal, in accordance with one embodiment. For a subset of the power supply modules, the controller 620 is configured to not only electrically connect the power supply modules in the subset together in parallel, but also to synchronize the dynamic waveform-controlled output signals of all the power supply modules in the subset to provide a total welding or cutting electrical signal that supports generation of an arc for welding or cutting. Details of the synchronization are discussed later herein with respect to FIG. 7.

The controller 620 is also configured to electrically connect a newly inserted hot-swappable power supply module into a subset while avoiding generating electrical surges within the module rack 610, and while avoiding generating disturbances in a welding or cutting electrical signal associated with the subset during a welding or cutting operation. In accordance with one embodiment, the controller 620 can avoid the occurrence of such surges and disturbances by bringing a newly inserted power supply module on-line slowly (e.g., by slowly powering up the newly inserted power supply module) and/or by electrically connecting various input and output pins of the newly inserted power supply module in a particular order.

In another embodiment, the subsets of power supply modules are defined largely by the module rack 610. For example, referring to FIG. 6, five (5) rows of slots 615 are shown within the module rack 610 which can be populated with hot-swappable power supply modules. The first row defines a first subset corresponding to up to ten (10) modules. Similarly, the second through fifth rows each define subsets corresponding to, respectively, up to ten (10), nine (9), eight (8), and seven (7) modules. In such an embodiment, the controller 620 is still used to support hot-swapping of the power supply modules to avoid surges and disturbances.

Each hot-swappable power supply module provides a dynamic waveform-controlled output signal. The outputs of the hot-swappable power supply modules within a defined subset are synchronized and electrically connected in parallel to form a total welding or cutting electrical signal to support generation of a single arc between an electrode and a workpiece for welding or cutting. For example, a total welding or cutting electrical signal from a subset of synchronized modules may be provided to a welding gun/torch and/or welding wire feeder within a welding or cutting environment. In this manner, the system 600 of FIG. 6 provides the dynamic welding or cutting voltages and currents to support various welding or cutting operations and modes. In accordance with one embodiment, each defined subset of power supply modules is under the control of the controller 620 to perform waveform generation.

Figure 7:
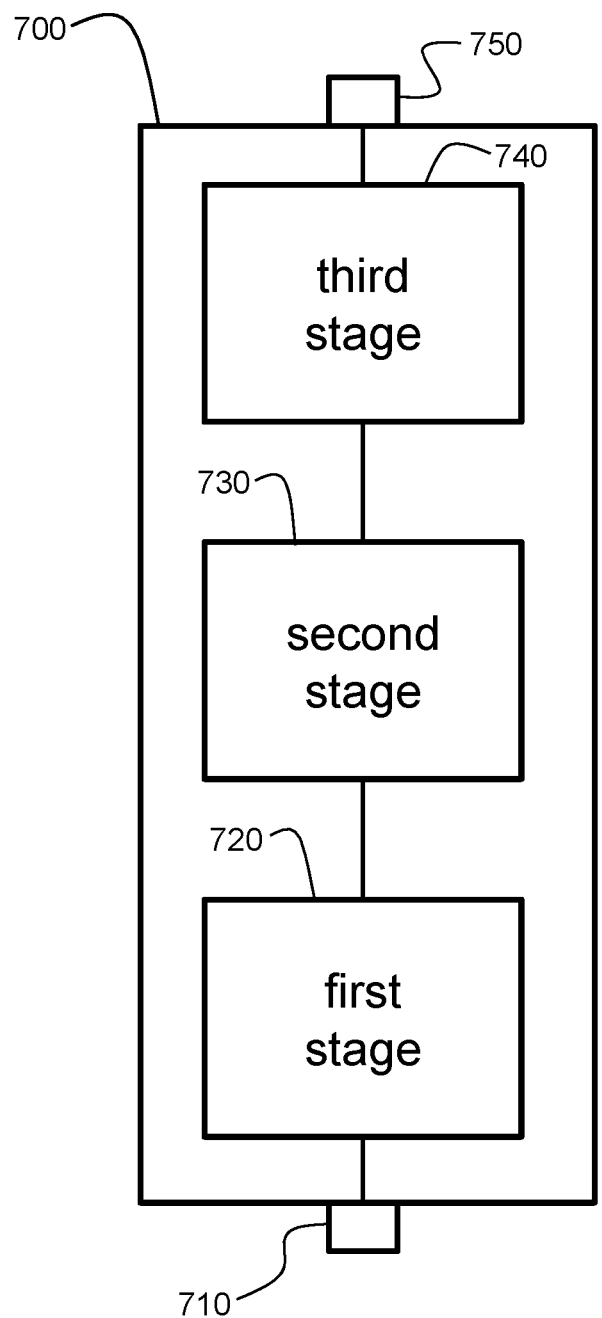
FIG. 7 illustrates a second embodiment of a power supply module (e.g., a hot-swappable power supply module) that may be used in the system of FIG. 6.

FIG. 7 illustrates a second embodiment of a hot-swappable power supply module 700 that may be used in the system 600 of FIG. 6. The hot-swappable power supply module 700 is configured to be inserted into and withdrawn from, for example, any of the slots 615 in the module rack 610 in a hot-swappable manner. The hot-swappable power supply module 700 includes an electrical input connector 710, a first power supply stage 720, a second power supply stage 730, a third power supply stage 740, and an electrical output connector 750. In the embodiment of FIG. 7, the third power supply stage 740 is an output power supply stage providing a dynamic waveform-controlled output signal. The dynamic waveform-controlled output signals generated by the third power supply stages 740 of the hot-swappable power supply modules 700 in a defined subset are synchronized and combined to generate a total welding or cutting electrical signal for welding or cutting.

The electrical input connector 710 is configured to accept electrical input power (e.g., AC input power). In one embodiment, the electrical input connector 710 is also configured to accept one or more control signals from a controller (e.g., from the controller 620 via a backplane of the module rack 610). The one or more control signals control the operations of the first power supply stage 720, the second power supply stage 730, and the third power supply stage 740, in accordance with one embodiment. U.S. Patent Application No. 2015/0014290 A1, which is incorporated by reference herein, describes various types of first (I), second (II), and third (III) power supply stages that are controlled by a controller.

The electrical output connector 750 is configured to output a dynamic waveform-controlled output signal. In one embodiment, the electrical output connector 750 is also configured to output one or more feedback signals to a controller (e.g., to the controller 620 via a backplane). The feedback signals may be derived from, for example, an output voltage and/or an output current of the module 700, in accordance with one embodiment, which are used by the controller 620 to modify the control signals. The feedback signals may also include module status signals. For example, a feedback signal may indicate when a particular module has failed (or has gone off-line). The controller can use the feedback information to report the failure to, for example, an external reporting system. As a result, a service call may be initiated to replace the failed module. In this manner, operation (e.g., power, waveform, timing) and status (e.g., failed module) of each power supply module can be monitored and controlled. Furthermore, in accordance with one embodiment, the feedback signals are used to modify the control signals to synchronize the outputs (i.e., the dynamic waveform-controlled output signals) of all of the active power supply modules 700 within a subset. Synchronization may be achieved by adjusting the timing of the outputs of the modules 700 with respect to each other, for example. The synchronized outputs, when combined, form a total welding or cutting electrical signal that supports generation of a single arc.

In one embodiment, the first power supply stage 720 is an AC to DC converter circuit. The second power supply stage 730 is an unregulated DC to DC converter circuit. The third power supply stage 740 includes a chopper circuit. For example, in one embodiment, the second power supply stage may include an inverter circuit with an isolation transformer and a rectifier circuit. The first power supply stage 720 accepts an electrical AC input signal, derived from the electrical input power to the module rack 610, at the electrical input connector 710. The second power supply stage 730 outputs an electrical DC signal to the third power supply stage 740. The third power supply stage 740 outputs a dynamic waveform-controlled output signal at the electrical output connector 750. Providing an electrical AC input to the module 700 is facilitated by a backplane of the module rack 610, in accordance with one embodiment. Also, synchronizing and combining the dynamic waveform-controlled output signals from the electrical output connectors 750 is facilitated by the backplane of the module rack 610, in accordance with one embodiment.

U.S. Patent Application No. 2015/0014290 A1, which is incorporated by reference herein, describes various types of first (I), second (II), and third (III) power supply stages. Other types of hot-swappable power supply modules are possible as well, in accordance with other embodiments. For example, in one embodiment, a hot-swappable power supply module may have a single stage. In another embodiment, a hot-swappable power supply module may have four stages. The numbers and types of stages depend on the design considerations and constraints associated with any particular application.

In accordance with one embodiment, each hot-swappable power supply module 700 provides 50 amps of electrical current. Therefore, a subset of such hot-swappable power supply modules 700 electrically connected in parallel can provide an electrical current of N×50 amps, where N is the number of power supply modules 700 synchronized and connected in parallel. Therefore, depending on the current need for a particular welding or cutting operation, the controller 620 can select the number N of power supply modules 700 to be electrically connected and used for that operation. In accordance with other embodiments, each hot-swappable power supply module 700 provides some other amount of electrical current (e.g. 30 amps, or 60 amps, or 90 amps).

Figure 8:
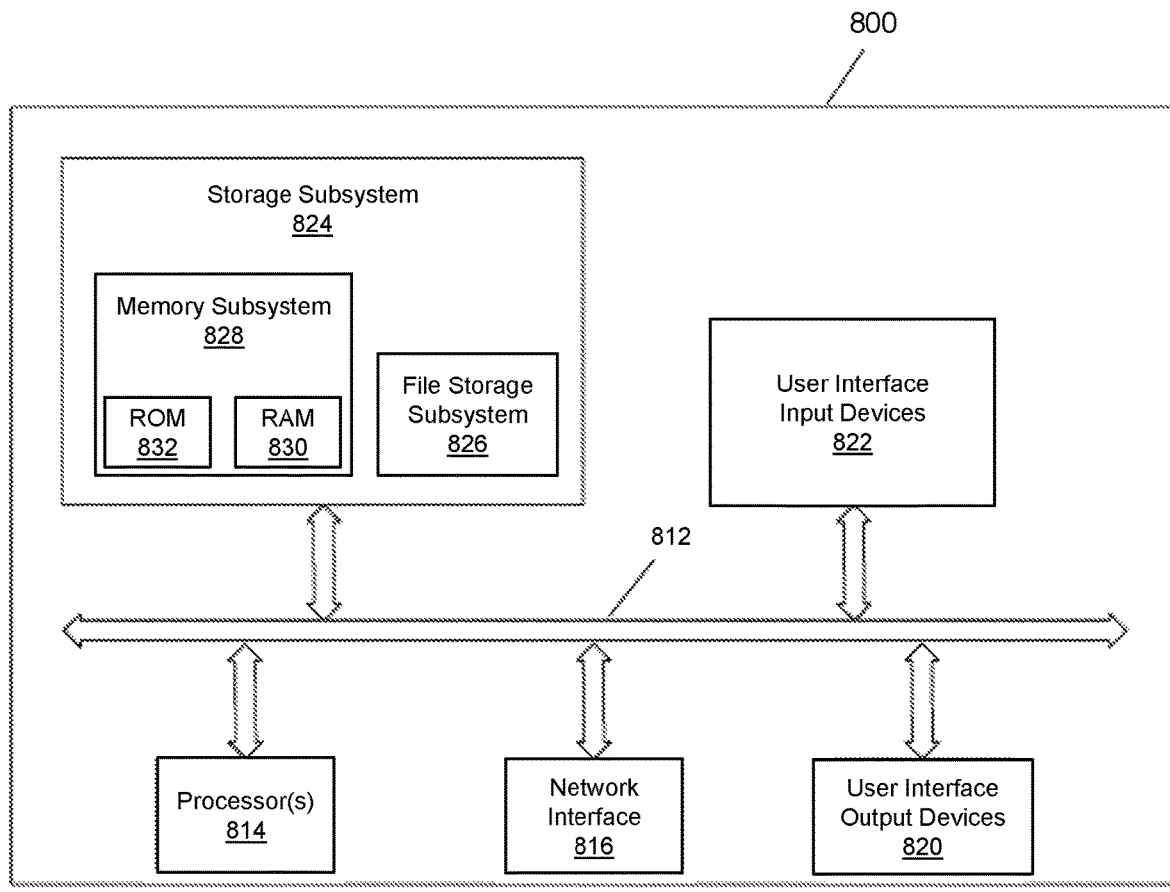
FIG. 8 illustrates one embodiment of an example controller that may be used as the controller in the systems of FIG. 1, FIG. 3, FIG. 4, FIG. 5, and FIG. 6.

FIG. 8 illustrates an embodiment of an example controller 800 that may be used as the controller 120, 320, 420, 520, or 620 respectively in the systems 100, 300, 400, 500, and 600 of FIG. 1, FIG. 3, FIG. 4, FIG. 5, and FIG. 6. The controller 800 includes at least one processor 814 which communicates with a number of peripheral devices via bus subsystem 812. These peripheral devices may include a storage subsystem 824, including, for example, a memory subsystem 828 and a file storage subsystem 826, user interface input devices 822, user interface output devices 820, and a network interface subsystem 816. The input and output devices allow user interaction with the controller 800. Network interface subsystem 816 provides an interface to outside networks and is coupled to corresponding interface devices in other computer systems. For example, the module rack 110 of the system 100 may share one or more characteristics with the controller 800 and may include, for example, elements of a conventional computer, a digital signal processor, and/or other computing device.

User interface input devices 822 may include a keyboard, pointing devices such as a mouse, trackball, touchpad, or graphics tablet, a scanner, a touchscreen incorporated into the display, audio input devices such as voice recognition systems, microphones, and/or other types of input devices. In general, use of the term "input device" is intended to include all possible types of devices and ways to input information into the controller 800 or onto a communication network.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image. The display subsystem may also provide non-visual display such as via audio output devices. In general, use of the term "output device" is intended to include all possible types of devices and ways to output information from the controller 800 to the user or to another machine or computer system.

Storage subsystem 824 stores programming and data constructs that provide some or all of the controller functionality described herein. For example, the storage subsystem 824 may include one or more software modules including computer executable instructions for electrically connecting, in a hot-swappable manner, a power supply module that is newly inserted into a module rack without generating any electrical surges within the module rack and without generating any disturbances in a welding or cutting electrical signal during a welding or cutting operation.

These software modules are generally executed by processor 814 alone or in combination with other processors. Memory subsystem 828 used in the storage subsystem can include a number of memories including a main random access memory (RAM) 830 for storage of instructions and data during program execution and a read only memory (ROM) 832 in which fixed instructions are stored. A file storage subsystem 826 can provide persistent storage for program and data files, and may include a hard disk drive, a floppy disk drive along with associated removable media, a CD-ROM drive, an optical drive, or removable media cartridges. The modules implementing the functionality of certain embodiments may be stored by file storage subsystem 826 in the storage subsystem 824, or in other machines accessible by the processor(s) 814.

Bus subsystem 812 provides a mechanism for letting the various components and subsystems of the controller 800 communicate with each other as intended. Although bus subsystem 812 is shown schematically as a single bus, alternative embodiments of the bus subsystem may use multiple buses.

The controller 800 can be of various implementations including a single computer, a single workstation, a computing cluster, a server computer, or any other data processing system or computing device configured to perform the controller functions described herein. Due to the ever-changing nature of computing devices and networks, the description of the controller 800 depicted in FIG. 8 is intended only as a specific example for purposes of illustrating some embodiments. Many other configurations of the controller 800 are possible having more or fewer components than the controller depicted in FIG. 8.

In accordance with one embodiment, each individual power supply module that is connected in parallel is configured to produce an output that has voltage droop such that the current loads are balanced without requiring a master controller to balance the loads. The voltage droop is proportional to the load drawn such that when power supply modules are connected in parallel, the output current load is shared among the power supply modules. Furthermore, each individual power supply module is configured to ramp up an output gradually such that the other power supply modules individually compensate their loads without interfering with the total load. When one of the power supply modules attempts to provide more current, an output voltage of that power supply will droop and the other power supply modules that are in parallel will provide balance. In this manner, the controller is effectively distributed among the different power supply modules.

For example, in accordance with one embodiment, power supply modules connected in parallel are configured to share the load current by trimming the no-load output voltage difference to be substantially less than the voltage droop at full load. In another embodiment, power supply modules are configured to share the load current by increasing the output voltage droop of each power supply module such that the voltage droop at full load is substantially larger than the no-load voltage mismatch between modules. The output voltage droop is internally adjusted, for example, by adjusting an internal reference voltage based upon the load current.

In summary, a reconfigurable modular power supply system provides redundancy, improved reliability, improved up-time, and improved serviceability across the welding or cutting environment. Such improvements are achieved by the implementation of multiple power supply modules (e.g., hot-swappable power supply modules) in a reconfigurable module rack.

While the disclosed embodiments have been illustrated and described in considerable detail, it is not the intention to restrict or in any way limit the scope of the appended claims to such detail. It is, of course, not possible to describe every conceivable combination of components or methodologies for purposes of describing the various aspects of the subject matter. Therefore, the disclosure is not limited to the specific details or illustrative examples shown and described. Thus, this disclosure is intended to embrace alterations, modifications, and variations that fall within the scope of the appended claims, which satisfy the statutory subject matter requirements of 35 U.S.C. § 101. The above description of specific embodiments has been given by way of example. From the disclosure given, those skilled in the art will not only understand the general inventive concepts and attendant advantages, but will also find apparent various changes and modifications to the structures and methods disclosed. It is sought, therefore, to cover all such changes and modifications as fall within the spirit and scope of the general inventive concepts, as defined by the appended claims, and equivalents thereof.

What is claimed is:

1. A reconfigurable multi-arc system to support generation of multiple arcs for welding or cutting, the system comprising:
   a module rack having a plurality of module slots and being configured to accept electrical input power from a single power drop within a welding or cutting environment via a power disconnect box;
   a plurality of power supply modules configured to be respectively inserted into and withdrawn from the plurality of module slots, wherein each power supply module of the plurality of power supply modules is configured to accept an electrical AC input derived from the electrical input power and provide an electrical DC output, and wherein the module rack is configured to support reconfigurable parallel electrical connections of subsets of the plurality of power supply modules inserted into the module rack; and
   a plurality of output power supply stages, wherein an electrical input of each output power supply stage of the plurality of output power supply stages is configured to connect to an electrical output of a separate subset of the subsets of the plurality of power supply modules, and wherein each output power supply stage of the plurality of output power supply stages is configured to provide a dynamic waveform-controlled welding or cutting electrical signal to support generation of a single arc, of the multiple arcs, between an electrode and a workpiece for welding or cutting.

2. The system of claim 1, further comprising a controller operatively interfacing to the module rack, wherein the controller is configured to:
   define and electrically connect in parallel a first subset of the subsets of the plurality of power supply modules within the module rack; and
   electrically connect a newly inserted power supply module of the plurality of power supply modules into the first subset while avoiding generating electrical surges within the module rack and while avoiding generating disturbances in a first welding or cutting electrical signal associated with the first subset during a first welding or cutting operation.

3. The system of claim 1, wherein each power supply module of the plurality of power supply modules includes a first power supply stage and a second power supply stage.

4. The system of claim 1, wherein each power supply module of the plurality of power supply modules includes an AC to DC converter circuit.

5. The system of claim 1, wherein each power supply module of the plurality of power supply modules includes an unregulated DC to DC converter circuit.

6. The system of claim 1, wherein each power supply module of the plurality of power supply modules includes an inverter circuit with an isolation transformer and a rectifier circuit.

7. The system of claim 1, wherein each output power supply stage of the plurality of output power supply stages includes a chopper circuit.

8. The system of claim 1, wherein each output power supply stage of the plurality of output power supply stages is configured to be located remotely from the module rack and be electrically connected to the module rack via an electrical cable.

9. The system of claim 1, wherein each output power supply stage of the plurality of output power supply stages is configured to be located within the module rack.

10. A reconfigurable multi-arc system to support generation of multiple arcs for welding or cutting, the system comprising:
a module rack having a plurality of module slots and being configured to accept electrical input power from a single power drop within a welding or cutting environment via a power disconnect box;
a plurality of power supply modules configured to be respectively inserted into and withdrawn from the plurality of module slots, wherein each power supply module of the plurality of power supply modules is configured to accept an electrical AC input derived from the electrical input power and provide a dynamic waveform-controlled output signal, and wherein the module rack is configured to support reconfigurable parallel electrical connections of subsets of the plurality of power supply modules inserted into the module rack; and
a controller operatively interfacing to the module rack and configured to synchronize the dynamic waveform-controlled output signal of each power supply module, of the plurality of power supply modules within each subset of the subsets, with each other to provide a welding or cutting electrical signal from each subset of the subsets that supports generation of a single arc, of the multiple arcs, between an electrode and a workpiece for welding or cutting.

11. The system of claim 10, wherein the controller is configured to synchronize the dynamic waveform-controlled output signal of each power supply module, of the plurality of power supply modules within each subset of the subsets, with each other based on feedback information from each corresponding subset of the subsets.

12. The system of claim 10, wherein the controller is configured to:
define and electrically connect in parallel a first subset of the subsets of the plurality of power supply modules within the module rack; and
electrically connect a newly inserted power supply module of the plurality of power supply modules into the first subset while avoiding generating electrical surges within the module rack and while avoiding generating disturbances in a first welding or cutting electrical signal associated with the first subset during a first welding or cutting operation.

13. The system of claim 10, wherein the controller is configured to report a failure of a power supply module of the plurality of power supply modules to an external reporting system.

14. The system of claim 10, wherein each power supply module of the plurality of power supply modules includes a first power supply stage, a second power supply stage, and a third power supply stage.

15. The system of claim 10, wherein each power supply module of the plurality of power supply modules includes an AC to DC converter circuit.

16. The system of claim 10, wherein each power supply module of the plurality of power supply modules includes an unregulated DC to DC converter circuit.

17. The system of claim 10, wherein each power supply module of the plurality of power supply modules includes an inverter circuit with an isolation transformer and a rectifier circuit.

18. The system of claim 10, wherein each power supply module of the plurality of power supply modules includes a chopper circuit.

19. A reconfigurable system to support the generation of at least one arc for welding or cutting, the system comprising:
a module rack having a plurality of module slots and being configured to accept electrical input power from a single power drop within a welding or cutting environment via a power disconnect box;
a plurality of power supply modules configured to be respectively inserted into and withdrawn from the plurality of module slots, wherein the module rack is configured to support reconfigurable parallel electrical connections of the plurality of power supply modules inserted into the module rack; and
a controller configured to electrically connect a newly replaced power supply module, of the plurality of power supply modules, within the module rack while avoiding generating electrical surges within the module rack and while avoiding generating disturbances in a welding or cutting electrical signal supported by the module rack during a welding or cutting operation.

20. The system of claim 19, wherein the controller is configured to report a failure of a power supply module of the plurality of power supply modules to an external reporting system.

* * * * *